United States Patent
Letavic et al.

[19]

[11] Patent Number: 6,023,090
[45] Date of Patent: Feb. 8, 2000

[54] LATERAL THIN-FILM SILICON-ON-INSULATOR (SOI) DEVICE HAVING MULTIPLE ZONES IN THE DRIFT REGION

[75] Inventors: Theodore Letavic, Putnam Valley; Mark Simpson, Ossining, both of N.Y.

[73] Assignee: Philips Electronics North America, Corporation, New York, N.Y.

[21] Appl. No.: 09/206,434

[22] Filed: Dec. 7, 1998

[51] Int. Cl.$^7$ .......................... H01L 21/266; H01L 27/01
[52] U.S. Cl. .......................... 257/347; 257/348; 257/349; 257/350; 257/351; 257/352; 257/353; 257/339; 257/367; 257/409; 257/488
[58] Field of Search .................................. 257/347–353, 257/339, 367, 409, 488

[56] References Cited

U.S. PATENT DOCUMENTS

| | | | |
|---|---|---|---|
| 5,246,870 | 9/1993 | Merchant | 437/21 |
| 5,294,824 | 3/1994 | Okada | 257/409 |
| 5,300,448 | 4/1994 | Merchant et al. | 437/41 |
| 5,378,912 | 1/1995 | Pein | 257/335 |
| 5,412,241 | 5/1995 | Merchant | 257/409 |
| 5,648,671 | 7/1997 | Merchant | 257/347 |
| 5,710,451 | 1/1998 | Merchant | 257/347 |

FOREIGN PATENT DOCUMENTS 2309336A  7/1997  United Kingdom .

OTHER PUBLICATIONS

PHA 23,337, U.S. application No. 08/998,048, Filed: Dec. 24,1997.

*Primary Examiner*—Fetsum Abraham
*Attorney, Agent, or Firm*—Steven R. Biren

[57] ABSTRACT

A lateral thin-film Silicon-On-Insulator (SOI) device includes a semiconductor substrate, a buried insulating layer on the substrate and a lateral MOS device on the buried insulating layer and having a source region of a first conductivity type formed in a body region of a second conductivity type opposite to that of the first. A lateral drift region of a first conductivity type is provided adjacent the body region, and a drain region of the first conductivity type is provided laterally spaced apart from the body region by the drift region. A gate electrode is provided over a part of the body region in which a channel region is formed during operation and over at least a part of the lateral drift region adjacent the body region, with the gate electrode being insulated from the body region and drift region by an insulation region. In order to provide an optimum combination of low "on" resistance and high breakdown voltage, the lateral drift region is provided with a plurality of spaced-apart zones of the second conductivity type extending horizontally in a lateral direction from the body region toward the drain region and having a varying charge level in the lateral direction.

9 Claims, 2 Drawing Sheets

LATERAL THIN-FILM SILICON-ON-INSULATOR (SOI) DEVICE HAVING MULTIPLE ZONES IN THE DRIFT REGION

BACKGROUND OF THE INVENTION

The invention is in the field of Semiconductor-On-Insulator (SOI) devices, and relates more particularly to lateral SOI devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral MOS device on the buried insulating layer, the MOS device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom by an insulation region, a lateral drift region of the first conductivity type, and a drain region of the first conductivity type laterally spaced apart from the channel region by the drift region.

A device of this type is shown in FIG. 1 common to related U.S. Pat. Nos. 5,246,870 (directed to a method) and 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping profile in the drift region and an overlying field plate, to enhance operation. As is conventional, this device is an n-channel or NMOS transistor, with n-type source and drain regions, manufactured using a process conventionally referred to as NMOS technology. An SOI device with a linearly-doped drift region of constant thickness is shown in U.S. Pat. No. 5,300,448, also commonly-assigned with the instant application and incorporated herein by reference.

More advanced techniques for enhancing high-voltage and high-current performance parameters of SOI power devices are shown in U.S. patent application Ser. No. 08/998,048, filed Dec. 24, 1997, commonly-assigned with the instant application and incorporated herein by reference. The use of multiple parallel zones having uniform doping in the drift region is shown in UK Patent Application GB 2,309,336A. Yet another technique for improving the performance of an SOI device is to form a hybrid device, which combines more than one type of device configuration into a single structure. Thus, for example, in U.S. patent application Ser. No. 09/122,407, filed Jul. 24, 1998, commonly-assigned with the instant application and incorporated herein by reference, an SOI device is disclosed which includes a lateral DMOS transistor and an LIGB transistor in the same structure.

Thus, it will be apparent that numerous techniques and approaches have been used in order to enhance the performance of power semiconductor devices, in an ongoing effort to attain a more nearly optimum combination of such parameters as breakdown voltage, size, current-carrying capability and manufacturing ease. While all of the foregoing structures provide varying levels of improvement in device performance, no one device or structure fully optimizes all of the design requirements for high-voltage, high-current operation.

Accordingly, it would be desirable to have a transistor device structure capable of high performance in a high-voltage, high-current environment, in which operating parameters, and in particular "on" resistance and breakdown voltage, are further optimized.

SUMMARY OF THE INVENTION

It is therefore an object of the present invention to provide a transistor device structure capable of high-performance in a high-voltage, high-current environment. It is a further object of the invention to provide such a transistor device structure in which operating parameters such as "on" resistance and breakdown voltage are enhanced.

In accordance with the invention, these objects are achieved in a lateral thin-film SOI device structure of the type described above in which the lateral drift region has a plurality of spaced-apart zones of the second conductivity type extending horizontally in a lateral direction from the body region toward the drain region and having a varying charge level in the lateral direction. In a preferred embodiment of the invention, the varying charge level in the lateral direction is obtained by providing the spaced-apart zones with a linear doping profile. Alternatively, the varying charge level in the lateral direction may be obtained by providing the zones with a uniform doping profile and a varying width in a horizontal direction perpendicular to the lateral direction.

In a further preferred embodiment of the invention, the spaced-apart zones of the lateral drift region are formed by surface zones which extend vertically only partly through the lateral drift region, and in yet a further preferred embodiment of the invention the spaced-apart zones extend from the body region toward but not in contact with the drain region.

Lateral thin-film SOI devices in accordance with the present invention offer a significant improvement in that a combination of favorable performance characteristics making the devices suitable for operation in a high-voltage, high-current environment, such as low "on" resistance and high breakdown voltage, can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
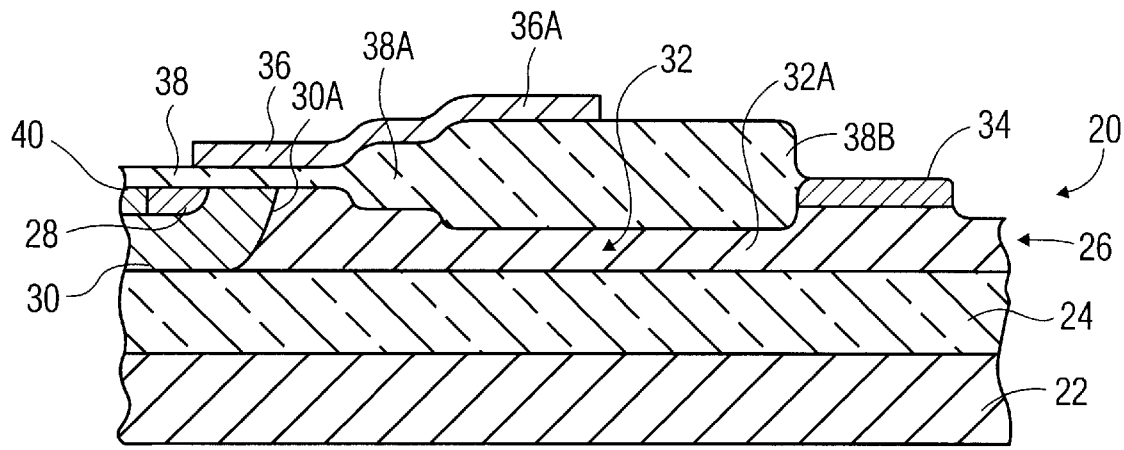
FIG. 1 shows a simplified cross-sectional view of a lateral thin-film SOI device in accordance with a preferred embodiment of the invention taken along the line 1—1 in FIG. 2.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

In the simplified cross-sectional view of FIG. 1, a lateral thin-film SOI MOS transistor 20 includes a semiconductor substrate 22, a buried insulating layer 24, and a semiconductor surface layer 26 in which the device is fabricated. The MOS transistor includes a source region 28 of one conductivity type, a body region 30 of a second, opposite conductivity type, a lateral drift region 32 of the first conductivity adjoining an edge 30A of the body region 30 and a drain region 34, also of the first conductivity type. The basic device structure is completed by a gate electrode 36, insulated from the underlying semiconductor surface layer 26 by an oxide insulation region 38. Within the scope of the invention, the MOS transistor structure used in the present invention may have various performance-enhancing features, such as a stepped oxide region 38A, 38B, an extended gate electrode structure forming a field plate portion 36A, and a thinned lateral drift region portion 32A and possibly even a further field plate on top of oxide region 32B, all as detailed in the aforementioned prior art, or other performance-enhancing features as desired, without departing from the spirit or scope of the invention. Alternatively, a lateral drift region of constant thickness, such as that shown in U.S. Pat. No. 5,300,448, may be employed. Additionally, the MOS transistor 20 may also include a surface contact region 40, in contact with source region 28, located in the body region 30 and of the same conductivity type as the body region but more highly doped.

It will be understood that the simplified, representative devices shown in the Figures depict particular device structures, but that wide variations in both device geometry and configuration can be used within the scope of the invention.

Figure 2:
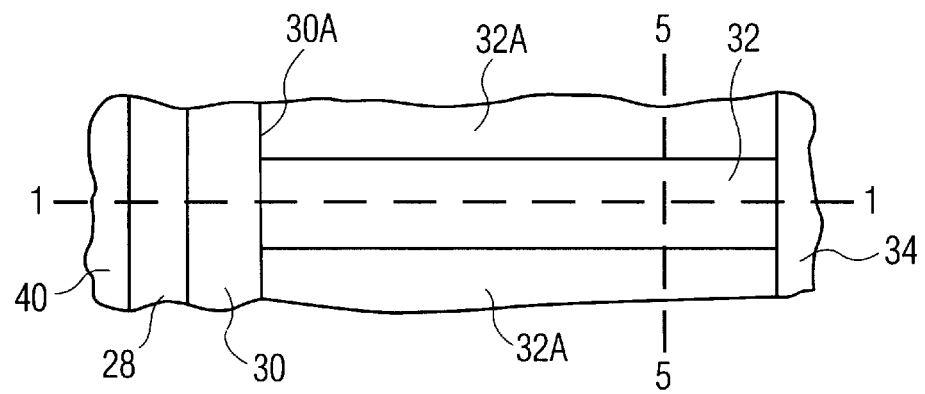
FIG. 2 shows a simplified plan view of the lateral thin-film SOI device of FIG. 1.

A simplified representative plan view of a device such as that shown in FIG. 1 is shown in FIG. 2. In FIG. 2, the lateral drift region 32 can be seen as extending between the right edge 30A of the body region 30 and the drain region 34, with a plurality of spaced-apart zones 32A of the second conductivity type extending horizontally in the lateral direction from the body region to the drain region. It will be understood that although only two such zones are shown in FIG. 2, actual devices will in fact typically have a larger number of spaced-apart zones provided in the drift region. While a great variety of geometries and doping profiles are contemplated within the scope of the invention, both the lateral drift region 32 and the spaced-apart zones 32A should have a varying charge level in the lateral direction. In a typical embodiment, wherein the drift region is of n-type conductivity and the zones are of p-type conductivity, the charge level in the lateral drift region 32 will increase in a direction from the body region toward the drain region, while the charge level in the zones 32A will decrease in that direction.

While it will be recognized that the present invention is not limited to any particular set of dimensions or charge levels, the width of the zones 32A and the drain region segments 32 between the zones 32A (in the direction of the line 5—5 in FIG. 2) may typically be in the range of 1 to 10 microns, with the varying charge level in these regions varying in the lateral direction by a factor of 5–10 times or greater from the body region edge 30A to the drain region 34 and with the charge level in the drain region segments and the zones varying in opposite directions. Thus, for a typical device having a 50 micron lateral drift region length, the charge level in the drift region portions 32 may vary from about $1 \times 10^{12}$ at/cm$^2$ at the body region and of the device to about $7 \times 10^{12}$–$1 \times 10^{13}$ at/cm$^2$ at the drain end of the device, with a similar but opposite variation in the charge level of the spaced-apart zones of the spaced-apart zones 32A.

Figure 3:
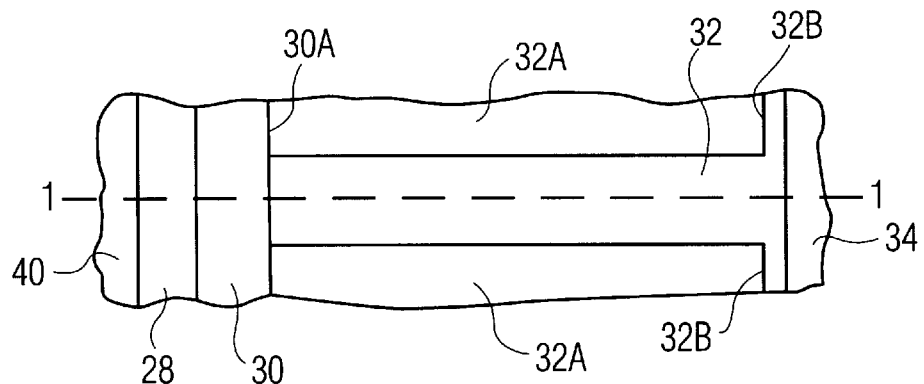
FIG. 3 shows a simplified plan view of a further preferred embodiment of the invention.

In the alternative embodiment shown the simplified plan view of FIG. 3, the structure is essentially similar to that shown in FIG. 2, except that the spaced-apart zones 32A extend toward the drain region 34 but do not contact the drain region. Rather, the zones 32A terminate at 32B before the drain region 34, typically by a distance in the range of about 5 to 10 microns, in order to further improve breakdown characteristics.

Figure 4:
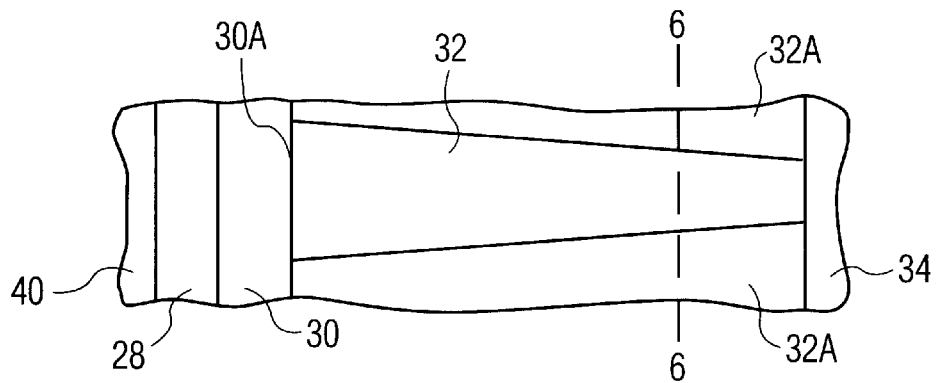
FIG. 4 shows a simplified plan view of yet a further preferred embodiment of a lateral thin-film SOI device in accordance with the invention.

In yet another embodiment of the invention, as shown in the simplified plan view of FIG. 4, the spaced-apart zones 32A are tapered, as are the portions of the drift region 32 in between the spaced-apart zones 32A. In this embodiment, the lateral drift region and zones will each have a constant doping level, rather than a linear or other varying doping level, with the varying charge level feature of the invention being provided by the varying width of the drift region segments and the spaced-apart zones (in the direction of the line 6—6 in FIG. 4). A typical variation in width of the zones 32A and regions 32 will be in the ratio of about 5 or 10 to 1 from one side of the device to the other, with the precise degree of tapering being a function of the degree of charge level variation desired for a particular design.

Figure 5:
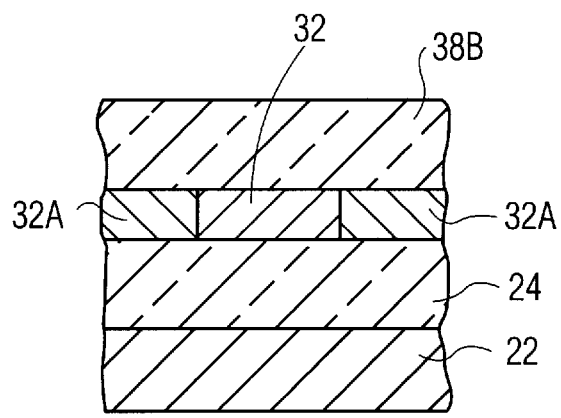
FIG. 5 shows a simplified cross-sectional view taken along the line 5—5 in FIG. 2.
Figure 6:
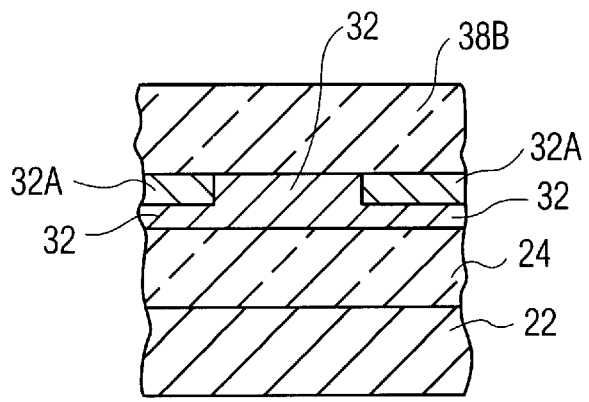
FIG. 6 shows a simplified cross-sectional view taken along the line 6—6 in FIG. 4.

Two further design variations are shown in the simplified cross-sectional views of FIGS. 5 and 6, taken along the lines 5–5 in FIG. 2 and 6–6 in FIG. 4, respectively. In these cross-sectional views, the various zones and regions previously described are shown in a direction orthogonal to the direction of the cross-section of FIG. 1. In the embodiment shown in FIG. 5, the spaced-apart zones 32A have the same vertical extent as the lateral drift region segments 32, extending from the insulation region 38B down to the buried insulating layer 24, whereas in FIG. 6, the zones 32A extend vertically from the surface only partly (typically half-way or less) through the lateral drift region, so that portions of the lateral drift region 32 remain beneath the zones 32A.

It will be recognized that the various illustrative embodiments described above may be used alternatively, or in combination, in either devices having a thinned drift region as shown in FIG. 1 or in devices having a substantially planar drift region as in U.S. Pat. No. 5,300,448, thus affording an extremely wide variation of applications for the present invention depending on the particular design parameters to be achieved.

In prior-art thin-film SOI devices, depletion of charge in the drift region occurs only through electric field interaction between the drift region and one or more overlying field plates, and is thus two-dimensional in nature. As a result, very high vertical electric fields result, thus necessitating the use of a very thin SOI layer for the drift region, resulting in an increase in "on" resistance. By providing strips or zones in the drift region, extending in the lateral direction from the body region toward the drain region, the depletion mechanism is converted from a two-dimensional mode to a three-dimensional mode, with additional charge depletion due to the p-n lateral junctions between the lateral drift region and the spaced-apart zones of opposite conductivity type. As a result, more charge can be introduced into the drift region, thus resulting in a significant decrease in the specific "on" resistance of the device for a given breakdown voltage. Furthermore, the provision of an additional depletion dimension results in a reduction of the vertical electric field in the drift region, thus permitting the construction of more robust devices and allowing for a thicker drift region SOI layer.

Finally, it will be recognized that the spaced-apart zones in accordance with the present invention may be fabricated using known prior-art techniques for providing such zones, such as implantation and/or diffusion.

In this manner, the present invention provides a transistor device structure capable of high-performance in a high-voltage, high-current environment, while enhancing the operating parameters of "on" resistance and breakdown voltage.

While the invention has been particularly shown and described with reference to several preferred embodiments thereof, it will be understood by those skilled in the art that various changes in form and detail may be made without departing from the spirit or scope of the invention.

What is claimed is:

1. A lateral thin-film Silicon-On-Insulator (SOI) device comprising a semiconductor substrate, a buried insulating layer on said substrate, and a lateral MOS device on said buried insulating layer and having a source region of a first conductivity type formed in a body region of a second conductivity type opposite to that of the first, a lateral drift region of said first conductivity type adjacent said body region, a drain region of said first conductivity type and laterally spaced apart from said body region by said lateral drift region, and a gate electrode over a part of said body region in which a channel region is formed during operation and over at least a part of said lateral drift region adjacent said body region, said gate electrode being insulated from said body region and drift region by an insulation region, said lateral drift region comprising a plurality of spaced-apart zones of said second conductivity type separated by portions of said lateral drift region and extending horizontally in a lateral direction from said body region toward said drain region, said lateral drift region of the first conductivity type and said zones of the second conductivity type each having a varying charge level in said lateral direction.

2. A lateral thin-film Silicon-On-Insulator (SOI) device as in claim 1, wherein said varying charge level in said lateral direction is obtained by providing said drift region and said zones with a linear doping profile.

3. A lateral thin-film Silicon-On-Insulator (SOI) device as in claim 2, wherein said spaced-apart zones of the lateral drift region comprise surface zones extending vertically only partly through said lateral drift region.

4. A lateral thin-film Silicon-On-Insulator (SOI) device as in claim 1, wherein said varying charge level in said lateral direction is obtained by providing said drift region and said zones with a uniform doping profile and a varying width in a horizontal direction perpendicular to said lateral direction.

5. A lateral thin-film Silicon-On-Insulator (SOI) device as in claim 4, wherein said spaced-apart zones of the lateral drift region comprise surface zones extending vertically only partly through said lateral drift region.

6. A lateral thin-film Silicon-On-Insulator (SOI) device as in claim 1, wherein said spaced-apart zones of the lateral drift region comprise surface zones extending vertically only partly through said lateral drift region.

7. A lateral thin-film Silicon-On-Insulator (SOI) device as in claim 1, wherein said spaced-apart zones extend from said body region to contact said drain region.

8. A lateral thin-film Silicon-On-Insulator (SOI) device as in claim 1, wherein said spaced-apart zones ex ten d from said body region toward but not in contact with said drain region.

9. A lateral thin-film Silicon-On-Insulator (SOI) device as in claim 1, wherein the varying charge level in said zones of the second conductivity type varies in a direction opposite to that of the variation in charge level in said lateral drift region.

* * * * *